United States Patent [19]

Heinle

[11] 4,432,065
[45] Feb. 14, 1984

[54] METHOD AND APPARATUS FOR GENERATING A PULSE TRAIN WITH VARIABLE FREQUENCY

[75] Inventor: Georg Heinle, Erlangen, Fed. Rep. of Germany

[73] Assignee: Siemens Aktiengesellschaft, Fed. Rep. of Germany

[21] Appl. No.: 217,904

[22] Filed: Dec. 18, 1980

[30] Foreign Application Priority Data

Dec. 21, 1979 [DE] Fed. Rep. of Germany ....... 2951927

[51] Int. Cl.$^3$ .............................................. H03K 5/04
[52] U.S. Cl. ..................................... 364/701; 377/47
[58] Field of Search .................. 364/701, 703; 328/38, 328/39, 48, 15; 235/92 PQ, 92 PB, 92 PL; 307/270; 377/47

[56] References Cited

U.S. PATENT DOCUMENTS

| | | | |
|---|---|---|---|
| 3,586,782 | 6/1971 | Thomas | 370/89 |
| 3,603,739 | 9/1971 | Edson | 370/89 |
| 3,632,881 | 1/1972 | Graham | 370/89 |
| 3,835,396 | 9/1974 | Demos et al. | 328/38 |
| 3,976,945 | 8/1976 | Cox | 328/48 |
| 4,017,719 | 4/1977 | Kaplan et al. | 364/701 |
| 4,241,408 | 12/1980 | Gross | 328/48 |
| 4,257,108 | 3/1981 | Igel | 235/92 PB |

OTHER PUBLICATIONS

"Elektronische Bausteinsysteme SIMATIK" by Rolf Hahn, vol. 1, 1974, pp. 244–245.

Primary Examiner—Jerry Smith
Assistant Examiner—Michael R. Fleming
Attorney, Agent, or Firm—Karl F. Milde, Jr.; Andrew G. Rodau

[57] ABSTRACT

For generating a pulse train having a variable frequency, in a first step a referance frequency is divided by the combined factor $D_r=N.p$, wherein N and p are integers. Thus, an auxiliary pulse train is obtained. In a next step, there are included (N−1) intermediate pulses having at least approximately the same distance from each other between adjacent pulses of the auxiliary pulse train. Thereby, in total a division of the reference frequency by the factor p is obtained. This method results in an improvement of the frequency resolution by the factor $N^2$ with respect to a method where the reference frequency is directly divided by the factor p. A circuit arrangement for carrying out this method contains a frequency divider, which issues small output pulses having the period $D_rT_o$, and (N−1) triggerable pulse emitters or generators, each of which delivering one of the aforementioned intermediate pulses.

8 Claims, 6 Drawing Figures

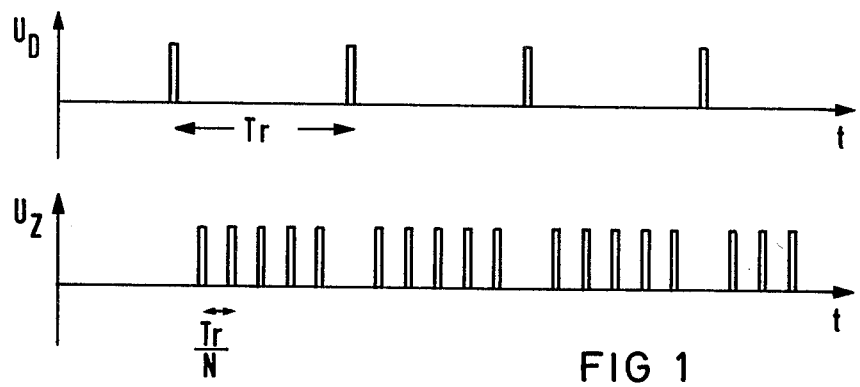
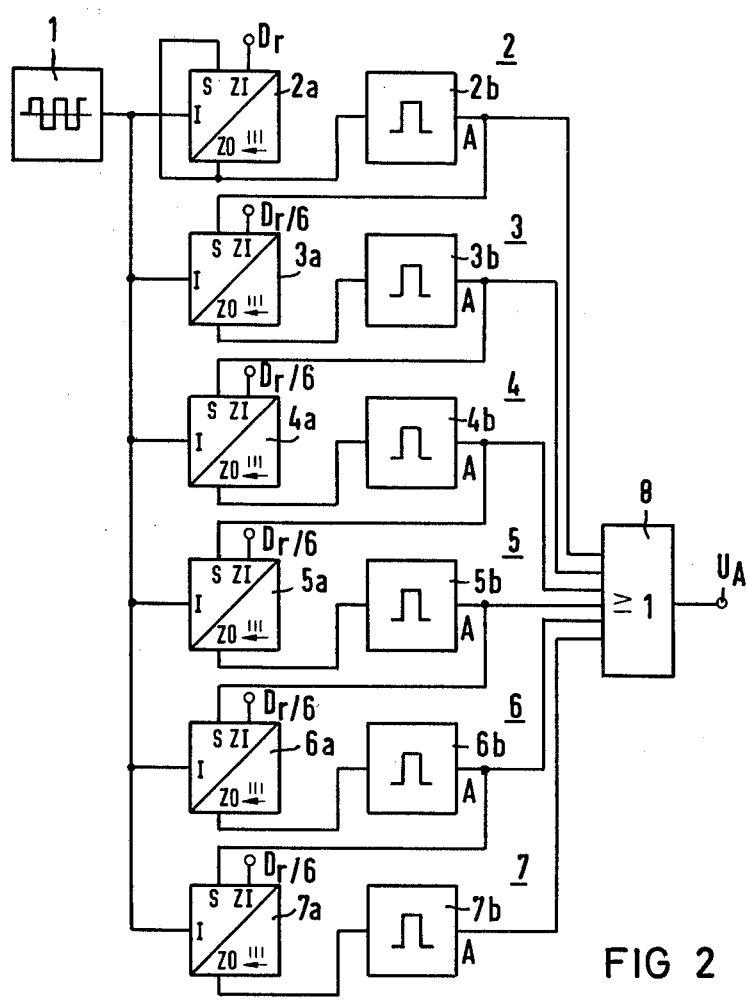
FIG 1
FIG 2

METHOD AND APPARATUS FOR GENERATING A PULSE TRAIN WITH VARIABLE FREQUENCY

BACKGROUND OF THE INVENTION

1. Field of the Invention

This invention relates to a method for generating a pulse train having a variable frequency. Particularly, this invention relates to a method for generating a pulse train in which the output frequency is generated by division of a reference frequency of a predetermined period by an adjustable division factor. This invention also relates to a circuit arrangement for carrying out the method. In particular, this invention relates to the generation of ignition pulses for a converter.

2. Description of the Prior Art

For example, from the German book "Elektronische Bausteinsysteme SIMATIC" by Rolf Hahn, volume 1, 1974, pages 244 to 245, a frequency divider is known in which a reference frequency is multiplied by a factor between 0 and 1 in order to obtain a desired output frequency. The multiplication method described in this publication may be employed also for the generation of a pulse train having an adjustable or variable frequency if one uses as reference frequency $f_O$ a fixed frequency which is generated, for example, by a quartz oscillator with high accuracy. The fixed frequency $f_O$ may be divided by a programmable divider by an adjustable division factor p. At the divider output, a pulse train having the frequency $F_A = f_{O/p}$ will be obtained. With such a method, however, the frequency resolution $\Delta f$, i.e. the smallest possible frequency variation, will become worse with the square of the output frequency $f_A$.

For $p >> 1$, there applies with very good approximation:

$$\Delta f = f_A^2/f_O = 1/f_O \cdot T_A^2, \text{ with } T_A = 1/f_A.$$

This equation demonstrates that the absolute frequency resolution $\Delta f$ becomes worse with the square of the output frequency $f_A$. It is also obvious from this equation that the relative frequency resolution $\Delta f/f_A$ will become worse proportionally to the output frequency $f_A$. For instance, if the required maximum output frequency $f_{Amax}$ is 2400 Hz and the oscillator frequency $f_O$ is 2 MHz, a frequency resolution $\Delta f = 2400^2$ Hz$/2 \cdot 10^6 = 2.88$ Hz will be obtained. For many applications, for example in frequency generators for converters, much better frequency resolutions, e.g. better than 0.6 Hz, are required.

An improvement of the frequency resolution might be obtained by increasing the oscillator frequency $f_O$. This, however, is often not possible for technological reasons, e.g. because of the limited working frequency of the components used.

SUMMARY OF THE INVENTION

1. Objects

It is an object of this invention to provide a method for generating a pulse train with variable frequency having an improved frequency resolution without increasing the reference or oscillator frequency. It is another object of this invention to provide an apparatus for generating a pulse train with variable frequency having an improved frequency resolution without increasing the reference or oscillator frequency.

2. Summary

According to this invention, the process for generating a pulse sequence having an adjustable frequency comprises the steps of:

(a) dividing a reference frequency having the period $T_O$ by the combined factor (N·p), wherein N is an integer and p is an adjustable integral division factor, thereby forming an auxiliary pulse train, and (b) inserting between two pulses of said auxiliary pulse sequence (N−1) pulses of an intermediate pulse sequence with at least approximately equal distance.

The basic idea of the invention resides in that at first the N multiple of the desired output period $T_A = 1/f_A$ is generated. From the above stated equation follows that thereby the frequency resolution is improved by the factor $N^2$. To obtain the desired output period $T_A$, there are then added or included within the output period (N−1) pulses as quidistantly as possible, in the following called "intermediate pulses".

It is of advantage if N is a power of 2. It is easy to produce the distance of the intermediate pulses if the period of the auxiliary pulse sequence is divided by $2^n$. If the multiplied output period is represented in the form of a binary number, this division can be carried out with a simple shift operation.

According to this invention, a circuit arrangement for the practice of the method is provided. It contains a pulse emitter or clock for the generation of the reference frequency with the period $T_O$ and a frequency divider which delivers narrow output pulses with the period $D_r \cdot T_O$. It also contains (N−1) triggerable pulse generators, each of which delivers at its output a narrow intermediate pulse. This intermediate pulse is issued a certain delay time after the arrival of a pulse at its trigger input. The trigger input of a first of the pulse generators is connected to the output of the frequency divider, and the trigger input of each additional pulse generator is connected to the output of the preceding pulse generator. Furthermore, the outputs of the frequency divider and of the pulse generators are connected to an OR gate, at the output of which the desired pulse train will be delivered.

Alternatively, the circuit arrangement may contain (N−1) triggerable pulse generators, each of which delivers at its output a narrow pulse. This pulse is issued a predetermined delay time $t_{vx}$ after arrival of a pulse at its trigger input. For the xth pulse generator, $t_{vx}$ is chosen to equal $x \cdot p \cdot T_O$. The trigger inputs of all pulse generators are connected to the output of the frequency divider, and the output of the frequency divider and the outputs of the pulse generators are connected to an OR gate, at the output of which the desired pulse train is issued.

Thus, the method according to the invention can be realized using simple, commercially available components. The delay times of the individual pulse generators can be selected such that there results a uniform distribution of the intermediate pulses over a period.

According to this invention, a further circuit arrangement for the practice of the above mentioned method is provided. It also contains a clock for generating the reference frequency having the period $T_O$, and a frequency divider connected to the output of the clock. The frequency divider delivers narrow output pulses with the period $D_r \cdot T_O$. In this embodiment, a triggerable pulse generator is provided which upon arrival of a pulse delivers at its trigger input a narrow pulse at its output A after a delay time $t_v = p \cdot T_O$. The trigger input is connected to the output of an OR gate with two inputs, the first input being connected to the output of the frequency divider and the second input via a locking stage to the output of the pulse generator. The locking stage will let pass in each period of the output pulse train (N−2) output pulses of the pulse generator. The output of the frequency divider and the outputs of the pulse generator are all connected to an OR gate, at the output of which the desired pulse train is delivered. In this embodiment only one triggerable pulse generator is required.

The foregoing and other objects, features and advantages of the invention will be apparent from the following more particular description of preferred embodiments of the invention, as illustrated in the accompanying drawings. In the various figures, equal components are provided with equal reference symbols.

BRIEF DESCRIPTION OF THE DRAWINGS

In the drawings:

FIG. 1 is a representation of two pulse diagrams for demonstrating the method according to this invention;

FIG. 2 is a first embodiment of an apparatus according to this invention;

DETAILED DESCRIPTION OF THE PREFERRED EMBODIMENT

FIG. 1 illustrates the principle on which a frequency generator according to the invention may work. According to the first diagram of FIG. 1, first the illustrated auxiliary pulse train $U_D$ is generated from the pulsed output voltage (not shown) of a clock having high frequency $f_O$ (period: $T_O = 1/f_O$) by division by the factor $D_r = N \cdot p$. N is an integer, and p in an adjustable integral factor. The period $T_r$ of the auxiliary pulse train $U_D$ is the N multiple of the desired output period $T_A$. Then, between adjacent pulses of the auxiliary pulse train $U_D$ there are inserted N−1 intermediate pulses. These intermediate pulses are placed approximately at the same distance from each other and from both side pulses of the auxiliary pulse train $U_D$. The inserted intermediate pulse sequence is marked $U_Z$ in the second diagram of FIG. 1. The intermediate pulses of each group are at a distance of $T_r/N$ to each other. By combination or addition of the two pulse sequences $U_D$ and $U_Z$ there results the desired output pulse train (not shown) having the output period $T_A = p \cdot T_O$ and the output frequency $f_A = f_O/p$.

The factor N and hence the number N−1 of the inserted pulses is chosen as a function of the desired frequency resolution $\Delta f$. Still other criteria may play a part in the selection of the factor N. If, for example, the frequency generator is used as a control device for a converter designed as a power supply of an electrical machine, it is expedient to select N so that $N = 6 \cdot p \cdot U$, p being the pole pair number of the electric machine fed by the converter and U being an integer factor. Asymmetries, which may be caused by the fact that the inserted intermediate pulses do not have the same distance between them, will then occur within U machine revolutions. The factor 6 results from the processing of the output frequency in a ring counter of the converter. As has been explained, there results a particularly simple generation of the intermediate pulses $U_z$ if one selects a power of 2 for the factor N. Thereby it is possible to achieve the necessary division by shifting in a shift register.

Figure 3:
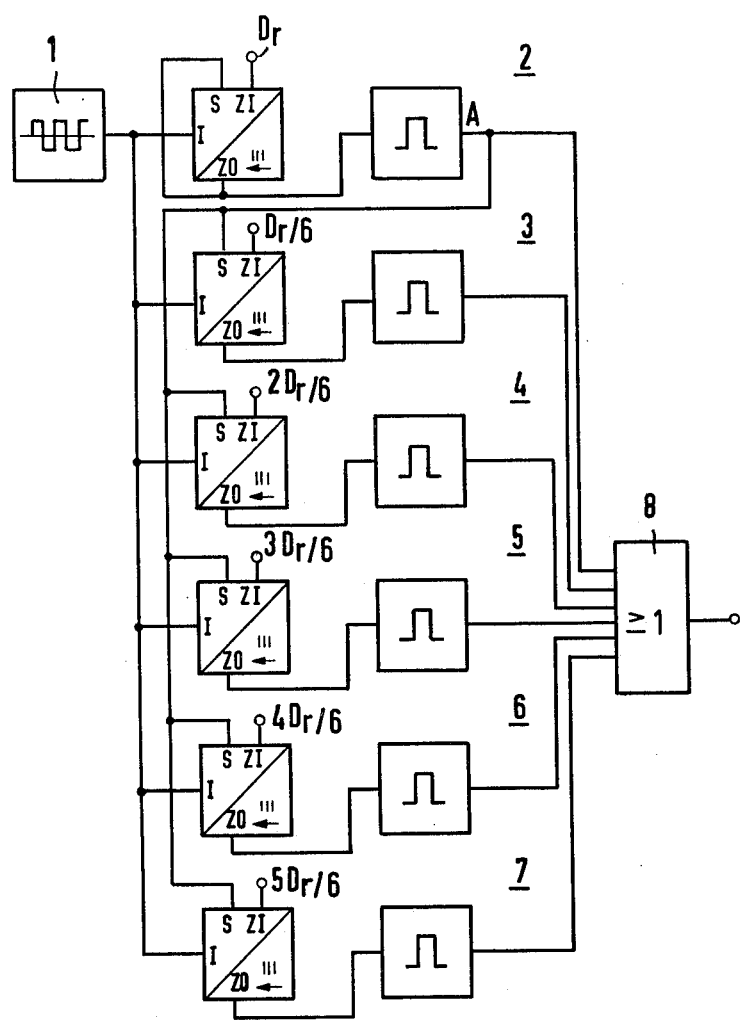
FIG. 3 is a second embodiment of an apparatus according to this invention.
Figure 4:
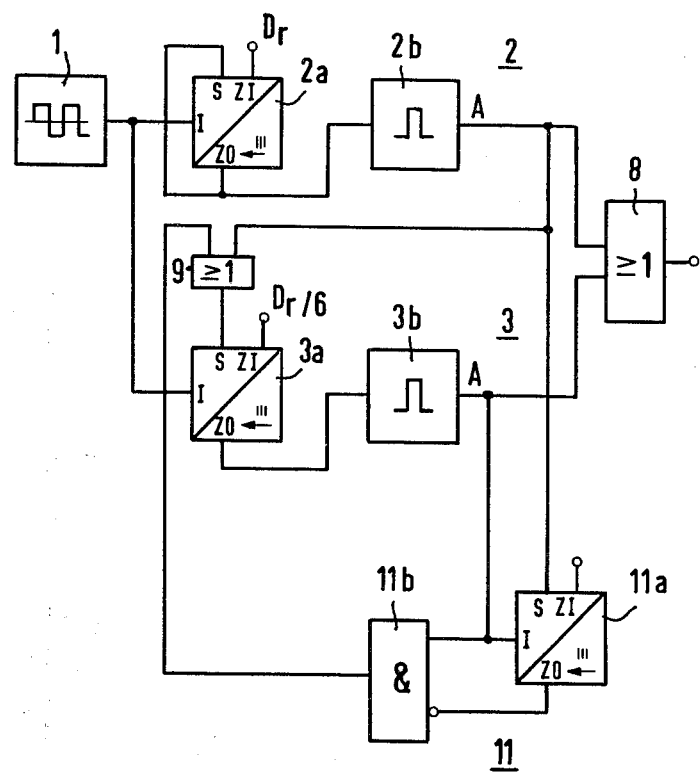
FIG. 4 is a third embodiment of an apparatus according to this invention.
Figure 5:
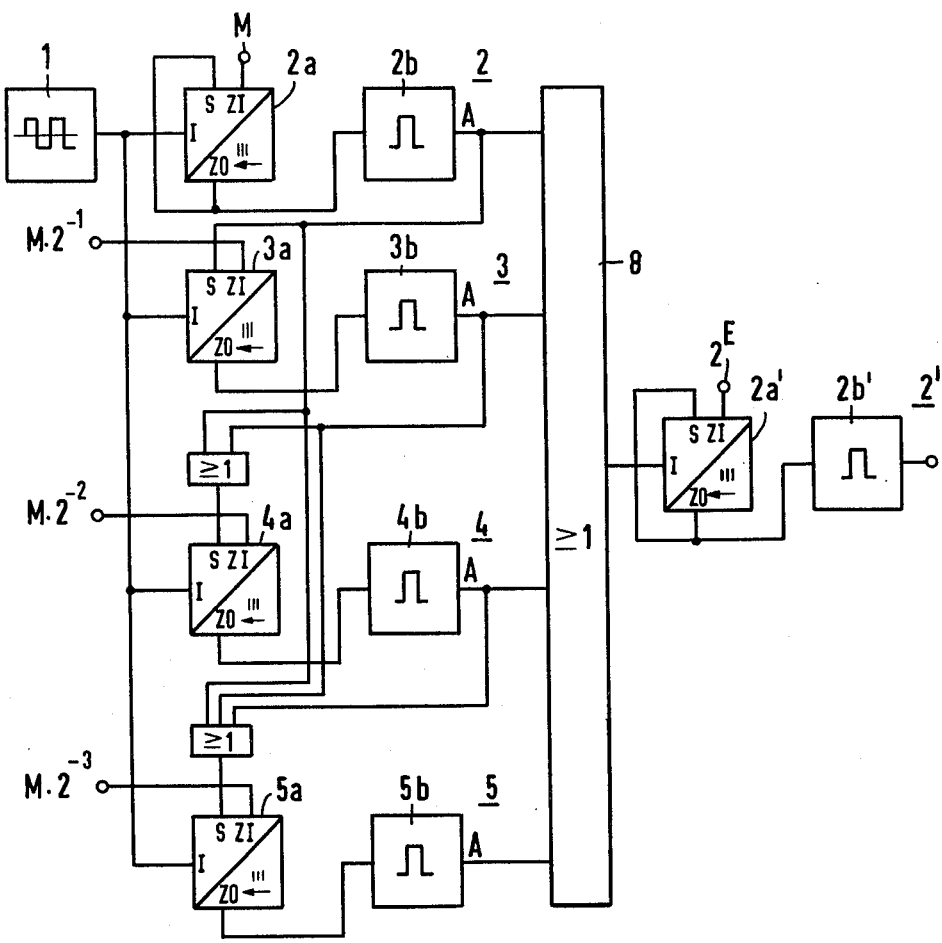
FIG. 5 is a fourth embodiment of an apparatus according to this invention.

In FIGS. 2 to 5, some circuit arrangements are shown by way of example for performing the method according to the invention. These various arrangements differ from each other in the formation of the intermediate pulses. The circuit arrangements according to FIGS. 2 to 4 are suitable especially for operation with integral numbers, while the circuit arrangement according to FIG. 5 is especially suitable for normalized floating-point numbers.

The circuit arrangements according to FIGS. 2 to 5 contain essentially two different function groups, namely a frequency divider 2 and triggerable pulse generators 3 to 7. These function groups will be explained below with reference to FIG. 2.

The frequency divider 2 has the function of forming narrow output pulses with the distance $N \cdot p \cdot T_O$ from the pulsed output voltage of a pulse emitter or clock 1 having the period $T_O$. The factor N.p will be designated below by $D_r$. According to FIG. 2 this function is performed using a downward counter 2a and a pulse generator 2b whereby the generator 2b is supplied by the counter 2a. The downward counter 2a has a preset input ZI, to which the number $D_r$ is supplied, which number serves as extension factor for the period. This preset input ZI can be activated via the activation input S. For instance, when a "1" signal is present at the activation input S, the number $D_r$ present at the preset input ZI is fed into the counter 2a. With each positive edge of the signal at the counter input I, the counter reading is lowered by one. When the counter reading is 0, the output ZO has "1" signal. The output ZO is connected with the activation input S, so that every time the counter 2a reaches the counter reading 0, the counter 2a is reset to the number $D_r$ present at the present input ZI. The output ZO is also connected to the input of a pulse generator 2b, which delivers a narrow pulse of defined length as soon as a "1" signal appears at the output ZO.

The triggerable pulse generators 3 to 7 have the function of delivering a narrow pulse in conjunction with each trigger pulse after a predetermined time has elapsed. In the embodiment of FIG. 2, this function is performed each time with a downward counter 3a to 7a. At the preset input ZI of these counters 3a to 7a, a number p is present for setting the delay time. Their counting inputs I are controlled by the clock 1. The number p at the preset input ZI is fed into the counter 3a to 7a upon arrival of a "1" signal at the activation input S. Each positive edge arriving at the counting input I lowers the counter reading by 1. A "1" signal is present at the output ZO of the counter 3a to 7a when the counter reading "0" has been reached. Connected to the output ZO of each counter 3a-7a is a pulse generator 3b to 7b, respectively, which delivers a narrow output pulse as soon as a "1" signal is present at the output ZO of the counter 3a to 7a.

There are commercially available also counters which upon reaching a certain counter reading deliver a short pulse. If such counters are applied, the pulse generators 2b to 7b of the frequency divider 2 and of the triggerable pulse generators 3 to 7 may be omitted.

With the just described function groups "frequency divider" and "triggerable pulse generator", the above described method of generating a pulse train can be performed in various ways.

In FIG. 2 is illustrated a circuit arrangement wherein $N-1=5$ intermediate pulses are inserted into a pulse sequence that is generated with the aid of a frequency divider 2, hence where $N=6$. The counting inputs I of the frequency divider 2 and of the five triggerable pulse generators 3 to 7 are connected to the output of the clock 1. The outputs A of the frequency divider 2 and of the triggerable pulse generators 3 to 7 are connected to the inputs of an OR gate 8, the output of which delivers the desired output pulse train $U_A$ of the adjustable frequency $f_A$. The trigger input S of the first triggerable pulse generator 3 is connected to the output A of the frequency divider 2, while the trigger input S of each following triggerable pulse generator 4 to 7 is connect to the output A of the preceding triggerable pulse generator 3 to 6, respectively. At the preset input ZI of the frequency divider 2a is present the division factor $D_r = N \cdot p$, while at the preset inputs ZI of the triggerable pulse generators 3 to 7 the number $p = D_r/N$ is present, that is, in the example, $D_r/6$. Thus, the frequency divider 2 forms from the output voltage of clock 1 an auxiliary pulse sequence $U_D$ whose period $T_r$ is longer by the factor $D_r = N \cdot p$ than the clock period $T_o$. This period $T_r$ is N times, i.e. 6 times, longer than the desired period $T_A$ of the output pulse train $U_A$. Therefore, $N-1=5$ intermediate pulses are added or introduced by aid of the triggerable pulse generators 3 to 7. The pulse generator 3 is triggered by the output of the frequency divider 2. After $D_r/6$ pulses of clock 1, it delivers an intermediate pulse at its output A, which simultaneously triggers the next pulse generator 4, and so forth. Each period of the output voltage $U_A$ is thus composed of a pulse of the frequency divider 2 and of an intermediate pulse of each of the pulse generators 3 to 7.

As the division of the division factor $D_r$ by N, (that is, in the example, by 6), generally leaves a remainder, asymmetries will occur in pulses within the period $T_r$ of the output voltage $U_A$. By upward rounding of $D_r/N$ for some pulse generators and downward rounding for other pulse generators, the asymmetries can be distributed evenly over the period $T_r$ in the output voltage $U_A$.

In the circuit arrangement according to FIG. 3, all pulse generators 3 to 7 are triggered by the output A of the frequency divider 2. In order to obtain the proper distances $D_r/N$ between the pulses of the frequency divider 2 and the various pulse generators 3 to 7, there is applied the number $D_r/6$ to the preset input ZI of the first pulse generator 3, the number $2 D_r/6$ to the second pulse generator 4, etc. Each pulse generator 3 to 7 thus delivers a pulse offset by $D_r/6$ relative to the pulse of the preceding pulse generator. Hence, also with this circuit arrangement the desired pulse train $U_A$ can be formed by means of intermediate pulses.

Another circuit arrangement is illustrated in FIG. 4. Here, the $N-1=5$ intermediate pulses are generated with only one pulse generator 3. The pulse generator 3 is at first triggered from the output A of the frequency divider 2. Then the pulse generator 3 triggers itself four times.

To this end, the outputs A of the frequency divider 2 and of the pulse generator 3 are connected via an OR gate 9 to the trigger input S of the pulse generator 3. To the preset input ZI of pulse generator 3, the number $D_r/6$ is applied. Hence, the pulse generator 3 delivers a first intermediate pulse which has the distance $D_r/6$ from the output pulse of the frequency divider 2. This first intermediate pulse activates the preset input ZI of the counter 3a, so that after the time $D_r/6$ the pulse generator 3 again delivers a pulse, etc. In order to achieve that the pulse generator 3 delivers only five intermediate pulses, that is, that it is triggered once by the frequency divider 2 and then triggers itself four times, the output pulses of the pulse generator 3 are supplied to the counting input of a counter 11a, at the preset input ZI of which the number 5 is present. The activation input S of the counter 11a is connected to the output of the frequency divider 2, so that with the first pulse of a period the number 5 is taken into the counter 11a. Between the output A of the pulse generator 3 and the OR gate 9, an AND gate 11b having a non-inverting and an inverting input is connected. The non-inverting input is connected to output A of the pulse generator 3, and the inverting input is connected to the output ZO of counter 11a. In this manner it is achieved that the pulse generator 3 delivers only five intermediate pulses and then does not trigger itself any more.

The circuit arrangement according to FIG. 4 is suitable especially when asymmetries in the period do not disturb, since these asymmetries cannot be evenly distributed by intentional upward and downward rounding of the number $D_r/6$, as in the circuit arrangements according to FIGS. 2 and 3. This disadvantage, however can be avoided by using not one, but for example two pulse generators (not shown). In this case, to the preset input ZI of the first pulse generator is supplied the downwardly rounded value of $D_r/N$, and to the second pulse generator is supplied the upwardly rounded value of $D_r/N$. By suitable switching of the trigger inputs of both pulse generators from the output of the frequency divider 2 to their own outputs or respectively to the output of the other pulse generator as a function of the magnitude of the remainder left in the division and of the pulse number within the period $T_r$, the asymmetries can be distributed evenly over the period $T_r$. Such an embodiment is not represented in FIGS. 2–5. In FIG. 5 another circuit arrangement is illustrated. This arrangement is suitable for performing the method according to the invention when the division factor $p = D$ is present as a normalized sliding-point number. The division factor D for the frequency $f_O$ of the output voltage of the clock 1 can be regarded as a period normalized to the clock period $T_O$, since there applies for the period $T_A$ of the output voltage of the circuit arrangements:

$$T_A = D \cdot T_O \text{ and hence } D = T_A/T_O.$$

The frequency resolution $\Delta f$ is dependent on the resolution of the normalized period D. D is represented as a normalized sliding-point number $D = 2^E \cdot M$, wherein E is the exponent and M the mantissa which corresponds to the factor $N \cdot p$, whereby n is an integer factor, if the exponent E is negative. The relative resolution of D will be dependent on the length of the mantissa M. The term "normalized" shall mean in this connection that the number of digits of the mantissa is constant and that no leading zeroes occur in the mantissa. The relative resolution can thus be determined by the length of the mantissa M. With the circuit arrangement according to FIG. 5 (described below) it is possible to realize the sliding-point number $D = 2^E \cdot M$ as a division factor for the clock frequency, or, in other words, as multiplier for the clock period. Therefore, the relative resolution of the frequency can be determined at will by the length of the mantissa M.

The circuit arrangement according to FIG. 5 contains the frequency dividers 2 and 2' and the pulse generators 3 to 5. As in the circuit arrangements described before, the counting inputs I of the frequency divider 2 and of the pulse generators 3 to 5 are connected to the output of the clock 1. The trigger input S of pulse generator 3 is connected to the output A of the frequency divider 2. The trigger input S of the pulse generator 4 is connected via an OR gate 4c to the output A of the frequency divider 2 and to the output A of the pulse generator 3, and the trigger input S of the pulse generator 5 is connected via an OR gate 5c to the outputs A of the frequency divider 2 and of the two preceding pulse generators 3 and 4. The output A of the frequency divider 2 and all outputs A of the pulse generators 3 to 5 are connected to one of the inputs of an OR gate 8. To the output of the OR gate 8 is connected a frequency divider 2'. At the output of this frequency divider 2' the desired pulse train $U_A$ is delivered.

To the preset input ZI of the frequency divider 2 is fed the number M, to the preset input ZI of the pulse generator 3 the number $M \cdot 2^{-1}$, to the preset input ZI of pulse generator 4 the number $M \cdot 2^{-2}$, to the preset input ZI of pulse generator 5 the number $M \cdot 2^{-3}$, and to the preset input ZI of the frequency divider 2' the number $2^E$. E is an exponent.

First the function of this circuit will be explained for positive exponents E. In this case, the number 0 is permanently present at the preset inputs ZI of the pulse generators 3 to 5, so that these pulse generators 3 to 5 are inactive. The output frequency delivered by the clock 1 is first divided by the mantissa M by means of the frequency divider 2 and then by $2^E$ by means of the following frequency divider 2', hence by $M \cdot 2^3$ in total. Thus, there applies for the output period $T_A$:

$$T_A = T_O \cdot (M \cdot 2^E)$$

As long as the exponent E is positive, no intermediate pulses are necessary.

With the frequency divider 2', however, negative exponents E cannot be realized. For negative exponents, therefore, the factor $M \cdot 2^{-E}$ is supplied to the preset inputs ZI of the pulse generators 3 to 5. At the preset input ZI of counter 2a' of the frequency divider 2' there is a "1", so that the latter acts as a simple pass. If, for example, $E=-3$, there is supplied to the preset input ZI of the pulse generator 3 the number $M \cdot 2^{-1}$, to the preset input ZI of pulse generator 4 the number $M \cdot 2^{-2}$, and to the preset input ZI of pulse generator 5 the number $M \cdot 2^{-3}$.

Figure 6:
FIG. 6 are four pulse diagrams relating to the apparatus according to FIG. 5.
Figure 6:
Figure 6:
Figure 6:
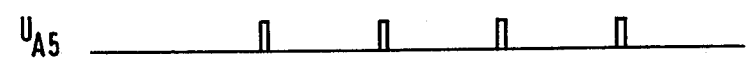

The pulse sequences $U_{A2}$ to $U_{A5}$ thereby resulting at the outputs A of the frequency divider 2 and of the pulse generators 3 to 5 are illustrated in FIG. 6. The auxiliary pulse sequence $U_{A2}$ exhibits the period $T_r = M \cdot T_O$. Since the number $M \cdot 2^{-1} = M/2$ is present at the preset input ZI of the counter 3a, the latter, triggered by the first output pulse of the frequency divider 2, delivers an intermediate pulse after one half period $T_r/2$. At the preset input ZI of pulse generator 4 there is present the number $M \cdot 2^{-2}$, that is, M/4. This pulse generator 4, therefore, triggered by the output pulse of the frequency divider 2, delivers an intermediate pulse after $T_r/4$ and, triggered by the output pulse of pulse generator 3, again after $T_r/4$. Correspondingly, the pulse generator 5, triggered by each pulse of the frequency divider 2 and of the pulse generators 3 and 4, delivers an intermediate pulse after the time $T_r/8$.

As FIG. 6 demonstrates, by combining or adding the pulses of the frequency divider 2 and of the pulse generators 3 to 5, there results a pulse sequence having the period $T_r/8$. Thus, as in the embodiments already described, the desired output pulse train $U_A$ is obtained in that 1. the period of the clock 1 is extended by the factor M, and that 2. in the example $2^3 - 1$ intermediate pulses are inserted into the pulse sequence thus obtained, so that in the end the desired extension of the period by the factor $M \cdot 2^{-3}$ is produced. The values $M \cdot 2^{-E}$ can be formed by simple shifting operations in a shift register.

As has been explained before, the relative accuracy of this circuit arrangement depends on the length of the mantissa M. If the mantissa M is extended by one digit, then, in order to obtain the same division factor, the exponent must be reduced by 1. To keep the possible range for the division factor constant, an additional divider is necessary for a negative exponent. In the example according to FIG. 6, for example, the relative accuracy could be improved by a factor of 2 by increasing the number of digits of the mantissa M by 1 and by adding a fourth pulse generator for the number $M \cdot 2^{-4}$.

In this circuit arrangement for normalized sliding-point numbers, no asymmetries occur for exponents $E > 0$. For exponents $E < 0$, the asymmetries are distributed very evenly within the period $T_r$.

While the method and apparatus for generating a pulse train with variable frequency herein described constitute preferred embodiments of the invention, it is to be understood that the invention is not limited to these precise forms, and that a variety of changes may be made therein without departing from the scope of the invention.

What is claimed:

1. An apparatus for generating a pulse train having an adjustable frequency, comprising:
   (a) a clock for generating a reference frequency $f_O$ having a period $T_O$;
   (b) a frequency divider connected to the output of said clock for delivering narrow output pulses with the period $D_r \cdot T_O$, wherein $D_r = N \cdot p$; N being an integer and p being an adjustable integer;
   (c) (N−1) triggerable pulse generators, each of which delivers a narrow intermediate pulse at its output at a delay time $t_v = p \cdot T_O$ after the arrival of a pulse at its trigger input; and
   (d) an OR gate;
   (d1) whereby the trigger input of a first one of said pulse generators is connected to the output of said frequency divider,
   (d2) whereby the trigger input of each additional one of said pulse generators is connected to the output of the preceding pulse generator, and
   (d3) whereby the outputs of said frequency divider and of said pulse generators are connected to said OR gate, the output of which delivers said desired pulse train.

2. An apparatus for generating a pulse train having a variable frequency, comprising:
   (a) a clock for generating a reference frequency $f_O$ having a period $T_O$;
   (b) a frequency divider connected to the output of said clock for delivering narrow output pulses with the period $D_r \cdot T_O$, wherein $D_r = N \cdot p$; N being an integer and p being an adjustable integer;

(c) (N−1) triggerable pulse generators, each of which delivers at its output a narrow pulse at a predetermined delay time $t_{vx}$ after the arrival of a pulse at its trigger input, whereby the final pulse generator of said (N−1) pulse generators, the delay time $t_{vx}$ is chosen to equal $x \cdot p \cdot T_O$ wherein x equals the number of pulse generators; and (d) an OR gate, (d1) whereby the trigger inputs of all pulse generators are connected to the output of said frequency divider, and (d2) whereby the output of said frequency divider and the outputs of said pulse generators are connected to said OR gate, the output of which delivers said desired pulse train.

3. An apparatus for generating a pulse train having an adjustable frequency, comprising:

(a) a clock for generating a reference frequency $f_O$ having a period $T_O$;

(b) a frequency divider connected to the output of said clock for delivering narrow output pulses with the period $D_r \cdot T_O$, wherein $D_r = N \cdot p$; N being an integer and p being an adjustable integer;

(c) a triggerable pulse generator which upon arrival of a pulse at its trigger input delivers a narrow pulse at its output after a delay time $t_v = p \cdot T_O$;

(d) a first OR gate having a first and a second input, the output of said first OR gate being connected to the trigger input of said triggerable pulse generator, and said first input of said first OR gate being connected to the output of said frequency divider;

(e) a locking stage, whereby said second input of said first OR gate being connected to the output of said triggerable pulse generator via said locking stage; and (f) a second OR gate, whereby the output of said frequency divider and the outputs of said pulse generator are connected to said second OR gate, the output of which delivering said desired pulse train.

4. An apparatus for generating a pulse train having an adjustable frequency, comprising:

(a) a clock for generating a reference frequency $f_O$ having a period $T_O$;

(b) a first frequency divider connected to the output of said clock for delivering narrow output pulses with the period $M \cdot T_O$, wherein M is defined by the dividing factor p which equals $M \cdot 2^E$, with M being a mantissa and E being an exponent;

(c) a predetermined number of triggerable pulse generators, each of which delivers a narrow pulse at its output at a predetermined delay time $t_{vx}$ after the arrival of a pulse at its trigger input, whereby for the final pulse generator of said triggerable pulse generators, the delay time $t_{vx}$ is chosen to equal $t_{vx} = M \cdot 2^{-x} \cdot T_O$, and whereby said predetermined number is equal to the desired maximum negative exponent and X equals the number of pulse generators;

(d) an OR gate, (d1) whereby the trigger input of each of said pulse generators is connected to the output of said first frequency divider and to the output of the preceeding pulse generator, and (d2) whereby the output of said first frequency divider and the outputs of said pulse generators are connected to the inputs of said OR gate; and (e) a second frequency divider having a division factor $2^E$ for positive exponents E and a division factor 1 for negative exponents E, said second frequency divider input being connected to the output of said OR gate, and the output of said second frequency divider delivering said desired pulse train.

5. The apparatus according to one of the claims 1 to 3, wherein said frequency divider comprises a downward counter and a monostable multivibrator, said downward counter having a counting input, a preset input, an activation input, and an output, wherein said counting input is the input of said frequency divider, wherein said preset input is supplied with a division factor, said division factor being delivered to said counter when said preset input is activated by said activation input, wherein said counter output issues a "1" signal when the counter reading is "0", and wherein said counter output is connected to said activation input and to the input of said monostable multivibrator.

6. The apparatus according to one of the claims 1 to 4, wherein said triggerable pulse generator comprises a downward counter and a monostable multivibrator, said downward counter having a counting input, a preset input, an activation input, and an output, wherein said counting input is connected to the output of said clock, wherein said preset input is supplied with a delay factor $F_v = T_O/t_v$, said delay factor being delivered to said counter when said preset input is activated by said activation input, wherein said counter output issues a "1" signal when the counter reading is "0", wherein said counter output is connected to the input of said monostable multivibrator, and wherein the activation input is the trigger input of the pulse generator.

7. The apparatus according to claim 3, wherein said locking stage comprises a downward counter and an AND gate, said downward counter having a counting input, a preset input, an activation input, and an output, said AND gate having a non-inverting and an inverting input, wherein the output of said pulse generator is connected to said counting input of said counter and to said non-inverting input of said AND gate, wherein the output of said frequency divider is connected with said activation input, wherein said counter output issues a "1" signal when the counter reading is "0", wherein said counter output is connected to said inverting input of said AND gate, and wherein said preset input is supplied with a number equal to (N−1), said number (N−1) being delivered to said counter when said preset input is activated by said activation input.

8. The apparatus according to claim 4, wherein each of said first and second frequency dividers comprises a downward counter and a monostable multivibrator, said downward counter having a counting input, a preset input, an activation input, and an output, wherein said counting input is the input of said frequency divider, wherein said preset input is supplied with a division factor, said division factor being delivered to said counter when said preset input is activated by said activation input, wherein said counter output issues a "1" signal when the counter reading is "0", and wherein said counter output is connected to said activation input and to the input of said monostable multivibrator.

* * * * *